United States Patent [19]  
Saitoh et al.

[11] Patent Number: 4,564,822  
[45] Date of Patent: Jan. 14, 1986

[54] TV TUNER OSCILLATOR WITH FEEDBACK FOR MORE LOW FREQUENCY POWER

[75] Inventors: Takeshi Saitoh, Tokyo; Hiroshi Hatashita, Yokohama, both of Japan

[73] Assignee: Hitachi, Ltd., Tokyo, Japan

[21] Appl. No.: 541,440

[22] Filed: Oct. 13, 1983

[30] Foreign Application Priority Data

Oct. 13, 1982 [JP] Japan ................. 57-178403

[51] Int. Cl.⁴ ............ H03B 5/12; H03C 3/20; H03H 5/12; H03J 3/20
[52] U.S. Cl. ............ 331/117 R; 331/177 V; 332/30 V; 334/15; 334/78; 455/262
[58] Field of Search ......... 331/36 C, 117 R, 117 FE, 331/177 V; 332/30 V; 334/15, 78; 455/262

[56] References Cited

U.S. PATENT DOCUMENTS 3,103,637 9/1963 Pan .................. 331/177 V
3,370,254 2/1968 Keller ............... 332/30 V
3,889,210 6/1975 Matsuura et al. ...... 331/177 V X

FOREIGN PATENT DOCUMENTS 2105151 2/1971 Fed. Rep. of Germany ........ 334/15
0028677 2/1980 Japan ......................... 332/30 V Primary Examiner—Eugene R. LaRoche  
Assistant Examiner—D. C. Mis  
Attorney, Agent, or Firm—Antonelli, Terry & Wands

[57] ABSTRACT

An oscillator circuit suitable for use in a local oscillator of a tuner of a television receiver set. A feedback circuit comprised of a feedback capacitor (17) is connected between a junction of a tuning diode (10) and a correcting capacitor (11) connected in series therewith and the emitter of an oscillation transistor (1). Oscillation voltage developing across the correcting capacitor is fedback to the emitter of the oscillation transistor through the feedback capacitors. When the tuning diode is conditioned to have a large capacitance value, a large oscillation voltage is fedback to the transistor through the feedback capacitor whereas when the tuning diode is conditioned to have a small capacitance value, a small oscillation voltage is fedback to the transistor through the feedback capacitor. The oscillator circuit continues to oscillate stably over a wide frequency range whenever the tuning diode changes from the small capacitance value to the large capacitance value or vice versa.

3 Claims, 3 Drawing Figures

TV TUNER OSCILLATOR WITH FEEDBACK FOR MORE LOW FREQUENCY POWER

This invention relates to an oscillator circuit for use in a local oscillator of a tuner of a television receiver set and more particularly to an oscillator circuit suitable for a local oscillator of a television receiver set which receives television signals of super frequency band (200 MHz to 300 MHz) and hyper frequency band (300 MHz to 450 MHz).

In recent years, the CATV (community antenna television) broadcasting has come into wide use remarkably and the advent of a television tuner has therefore been desired urgently which can receive VHF and UHF band television signals as well as CATV television signals. Especially, in the CATV broadcasting, desirability has been directed to a television tuner which can receive television signals of two bands, that is, super frequency band and hyper frequency band.

Figure 1:
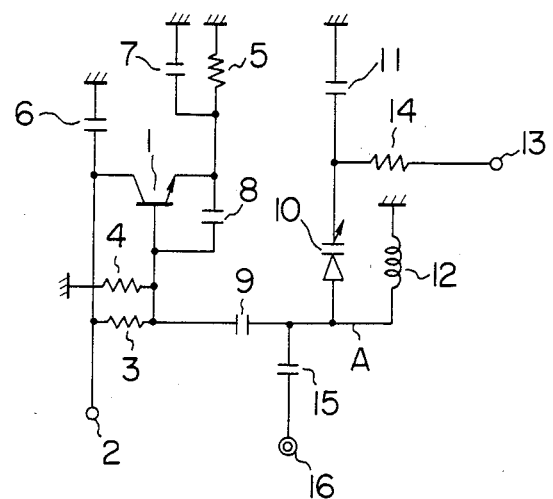
FIG. 1 shows a circuit diagram of a prior art oscillator circuit.

By referring to a prior art oscillation circuit as shown in FIG. 1, problems will be described which are involved in a local oscillator used in a tuner adapted to receive television signals of super frequency band and hyper frequency band. Specifically shown in FIG. 1 is a Clapp oscillator circuit typically used in the local oscillator of the tuner. In FIG. 1 there are seen an oscillation transistor 1, a terminal 2 through which power supply voltage for driving the transistor 1 is fed, bias resistors 3 and 4 which determine a base voltage of the transistor 1, an emitter resistor 5, a capacitor 6 of large capacitance through which the collector of transistor 1 is connected to common potential, that is, grounded, an emitter capacitor 7, a feedback capacitor 8 connected between the emitter and the collector of transistor 1, a coupling capacitor 9 connected between the transistor 1 and a tank circuit, a tuning diode 10 comprised of a variable capacitance diode, a capacitor 11 adapted to correct the range over which the oscillation frequency changes, and a tuning coil 12. The tuning diode 10, the capacitor 11, and the tuning coil 12 constitute the tank circuit.

An oscillation voltage generated in the tank circuit develops at a junction A of the tuning diode 10 and tuning coil 12. The oscillation voltage is divided by the capacitors 9, 8 and 7 and fedback from the base to the emitter of transistor 1.

A tuning voltage fed to a terminal 13 is applied through a resistor 14 to a tuning diode 10 so as to change the capacitance of the variable capacitance diode 10. As a result, the oscillation frequency of the oscillator circuit is changed. Oscillation power is passed through a coupling capacitor 15 having a capacitance of 0.5 to 1 pF and delivered out of a terminal 16. With a capacitance of the coupling capacitor 9 selected to be large, the oscillator circuit shown in FIG. 1 continues to oscillate even when the tuning voltage is changed from 0 (zero) V to 30 V. Under this condition, however, the capacitors 7 and 8 and the input capacitance of the transistor 1 have a great effect on the oscillation with the result that it is difficult for the oscillator circuit to oscillate at a frequency within a range of 260 MHz to 480 MHz which is necessary for receiving the television signals of super frequency band and hyper frequency band. Accordingly, it is practiced to use a tuning diode 10 which is specified to change its capacitance from 25 pF to 3 pF in response to 2 V to 25 V of the tuning voltage fed to the terminal 13 and to select a coupling capacitor 9 of small capacitance.

When, in this oscillator circuit, a low tuning voltage is applied to the tuning diode 10 so that the capacitance of the tuning diode 10 is increased to decrease the oscillation frequency, load Q in the tank circuit comprised of the tuning diode 10, the capacitor 11 and the tuning coil 12 is increased and consequently, the insertion loss of the tank circuit is so increased that the oscillator circuit stops oscillating. In addition, since the capacitance of the capacitor 9 is selected to be small, the capacitor 9 also increases the insertion loss within a range of low frequencies.

An object of this invention is to provide an oscillator circuit capable of stably oscillating within a frequency range suitable for reception of television signals of super frequency band and hyper frequency band.

According to this invention, oscillation voltage of an oscillator circuit is divided by a tuning diode and a capacitor both included in a tank circuit and fedback to the emitter of an oscillation transistor so as to stabilize the oscillator circuit. The division of oscillation voltage determined by the tuning diode and capacitor of the tank circuit is increased as the capacitance of the tuning diode increases. Structurally, in the oscillator circuit according to this invention, a junction of the tuning diode and the capacitor in the tank circuit is connected to the emitter of the oscillation transistor through a capacitor so as to feedback the oscillation voltage from the tank circuit to the emitter of the oscillation transistor.

Figure 2:
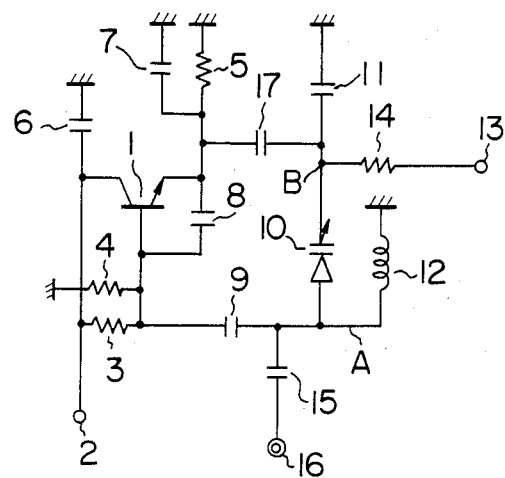
FIG. 2 shows a circuit diagram of an oscillator circuit according to this invention.

Referring now to FIG. 2, a preferred embodiment of this invention will be described. In FIGS. 1 and 2, like elements are designated by like reference numerals. According to teachings of the present invention, a capacitor 17 is connected between the emitter of an oscillation transistor 1 and a junction B of a tuning diode 10 and a capacitor 11. By connecting the capacitor 17, oscillation voltage developing across the capacitor 11 of a tank circuit can be fedback to the emitter of the transistor 1 through the capacitor 17. When the capacitor 11 has a capacitance of about 56 pF and the tuning diode 10 has a small capacitance of about 3 pF so that the oscillator circuit oscillates at a high oscillation frequency, the oscillation voltage developing at the junction B of the tuning diode 10 and capacitor 11 is small. Consequently, a small voltage is fedback through the capacitor 17. This accounts for the fact that when the tuning diode 10 is changed to have a small capacitance, the oscillator circuit is not so much affected by the capacitor 17 as to disturb the manner of the conventional oscillation. When the capacitance value of the tuning diode 10 is changed or increased to about 25 pF by a voltage fed to the terminal 13, the oscillation frequency of the oscillator circuit is decreased. Since oscillation voltage developing at a junction A is divided by the tuning diode 10 and capacitor 11, an oscillation voltage developing at the junction B increases. The division of oscillation voltage is applied to the emitter of the transistor 1 through the capacitor 17. Thus, as the capacitance of the tuning diode 10 is changed to a large value to increase the load Q in the tank circuit, the amount of the oscillation voltage to be fedback to the emitter of the transistor 1 increases, thereby ensuring that the oscillator circuit can oscillate stably.

Figure 3:
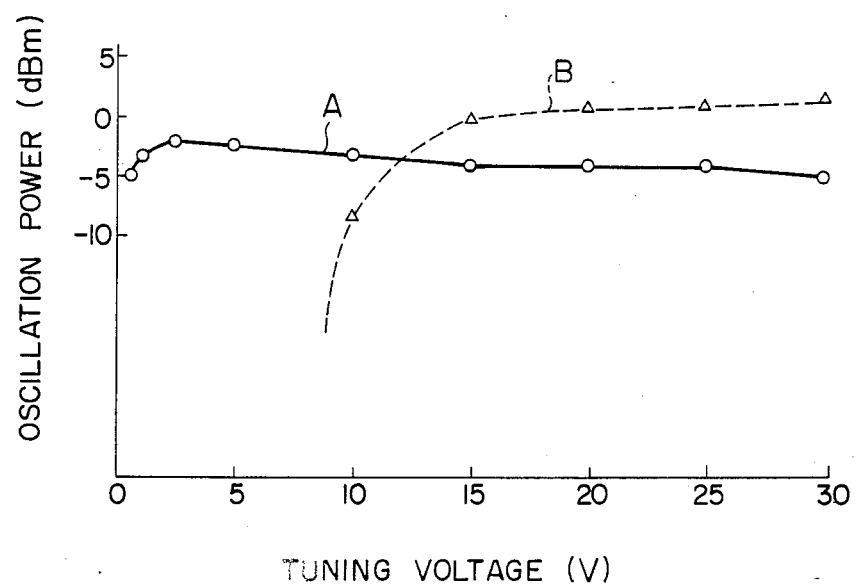
FIG. 3 is a graph showing oscillation characteristics of the oscillator circuits shown in FIGS. 1 and 2.

Oscillation powers obtained by the oscillator circuit of this invention and the prior art oscillator circuit are plotted in a graph shown in FIG. 3. In FIG. 3, ordinate represents oscillation power and abscissa tuning voltage. The oscillation power of the oscillator circuit according to this invention is represented by a continuous line A. The oscillation power of the prior art oscillator circuit, represented by a dotted curve B, decreases as tuning voltage decreases below about 15 V until the oscillator circuit stops oscillating at about 9 V of the tuning voltage. In the oscillator circuit of this invention, on the other hand, the oscillation power remains subtantially constant within a range over which the tuning voltages changes from about 1 V to about 30 V to ensure that the oscillation continues stably. The oscillation frequency of the oscillator circuit according to this invention can of course be changed steadily over the super frequency band and hyper frequency band. The oscillation power shown in FIG. 3 was measured at a terminal 16 under the conditions that capacitance of the coupling capacitor 9 was selected as 4 pF, capacitance of the capacitor 17 as 18 pF and capacitances of the capacitors 7, 8 and 9 as 6 pF, 9 pF and 56 pF, respectively.

As described above, according to this invention, the oscillation voltage developing across the correcting capacitor connected in series with the tuning diode is fedback to the emitter of the transistor through the feedback capacitor connected between the correcting capacitor and the emitter of the transistor. Consequently, when the tuning diode is conditioned to have a small capacitance, a small voltage is fedback to the emitter whereas when the tuning diode is conditioned to have a large capacitance, a large voltage is fedback to the emitter. Even with the large capacitance of the tuning diode, the oscillator circuit can oscillate stably. With the oscillator circuit of this invention applied to the local oscillator of television receiver sets, the oscillation frequency can steadily be changed with in a frequency range suitable for reception of television signals of super frequency band and hyper frequency band.

We claim:

1. An oscillator circuit for use in a local oscillator of a tuner, which is responsive to a tuning voltage to change its oscillation frequency, said oscillator circuit comprising:
   a transistor;
   a first capacitor connected between the emitter of the transistor and a common potential;
   a second capacitor connected between the base and emitter of the transistor;
   a tank circuit including a tuning diode, a coil and a third capacitor, whith the third capacitor and the coil connected to the common potential and with the tuning diode connected in series between the third capacitor and the coil;
   a fourth capacitor connected between a junction of said tuning diode and coil and the base of said transistor; and
   a fifth capacitor connected between a junction of said tuning diode and said third capacitor and the emitter of said transistor.

2. An oscillator circuit for use in a TV tuner having a tuning diode, comprising:
   a transistor having a collector, an emitter and a base, said collector being connected to a common potential;
   a first capacitor connected between the emitter of said transistor and said common potential;
   a second capacitor connected between the base and the emitter of said transistor;
   a tank circuit including said tuning diode, a coil and a third capacitor, said third capacitor and said coil being connected to said common potential, and said tuning diode being connected in series between said third capacitor and said coil;
   a fourth capacitor connected between the base of said transistor and a junction of said tuning diode and said coil;
   a fifth capacitor connected between the emitter of said transistor and a junction of said-tuning diode and said third capacitor; and
   a tuning voltage supplying terminal connected to the junction of said tuning diode and said third capacitor through a resistor;
   whereby said fifth capacitor enables the oscillator circuit to oscillate stably over a wide frequency range.

3. An oscillator circuit according to claim 2, further comprising an oscillating signal output terminal connected to the junction of said tuning diode and said coil through a sixth capacitor.

* * * * *